(12) United States Patent
Hogan et al.

(10) Patent No.: US 6,459,648 B1
(45) Date of Patent: Oct. 1, 2002

(54) FAULT-TOLERANT ADDRESS LOGIC FOR SOLID STATE MEMORY

(76) Inventors: Josh N. Hogan, 620 Kingswood Way, Los Altos, CA (US) 94022; Ron M. Roth, 33 Ruth Street, Haifa 34404 (IL)

( * ) Notice: Subject to any disclaimer, the term of this patent is extended or adjusted under 35 U.S.C. 154(b) by 0 days.

(21) Appl. No.: 09/976,748

(22) Filed: Oct. 13, 2001

(51) Int. Cl.[7] .................................................. G11C 8/00
(52) U.S. Cl. .................... 365/230.06; 365/200
(58) Field of Search ............................ 365/230.06, 200; 711/218; 714/733

(56) References Cited

U.S. PATENT DOCUMENTS

| | | | | |
|---|---|---|---|---|
| 4,556,960 A | * | 12/1985 | Cohn et al. ................. | 711/218 |
| 5,487,040 A | * | 1/1996 | Sukegawa et al. .......... | 365/200 |
| 5,721,498 A | * | 2/1998 | Moson et al. ................ | 326/38 |
| 6,360,344 B1 | * | 3/2001 | Khoche et al. .............. | 714/733 |
| 6,272,056 B1 | * | 8/2001 | Ooishi ......................... | 365/200 |
| 6,295,231 B1 | * | 9/2001 | Toda et al. ............. | 365/189.01 |
| 6,304,989 B1 | * | 10/2001 | Kraus et al. ................. | 714/733 |

* cited by examiner

*Primary Examiner*—Son Mai

(57) ABSTRACT

A set of address elements is configured by assigning a set of address configurations having a symmetric distance of at least t+1, where t is the maximum allowable number of defective address lines.

29 Claims, 7 Drawing Sheets

FIG. 5a
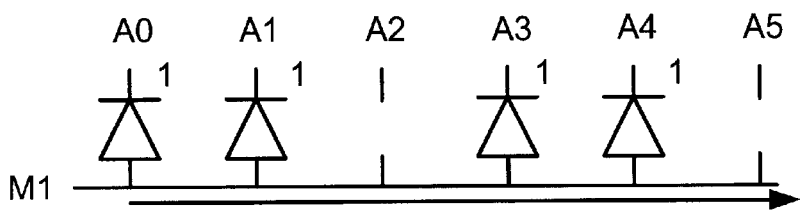
FIG. 5b
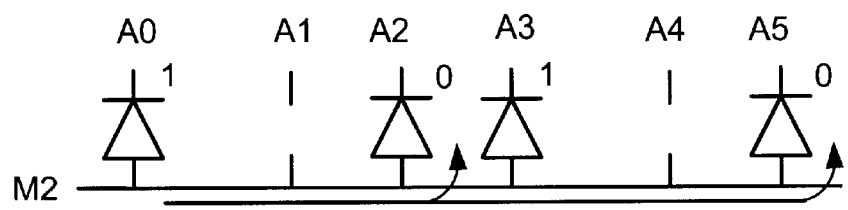
FIG. 7
ASSIGN A SET OF NON-COVERING ADDRESS CONFGURATONS HAVING A SYMMETRIC DISTANCE OF AT LEAST t+1 — 710

FAULT-TOLERANT ADDRESS LOGIC FOR SOLID STATE MEMORY

BACKGROUND

The present invention relates to information storage devices. More specifically, the present invention relates to address logic for solid state memory.

Portable devices such as PDAs, handheld computers, digital cameras and digital music players include memory for storing data, digital images and MP3 files. Different types of memory are available for these portable devices. Conventional memory types include flash memory, mini-hard drives, mini-compact discs, and magnetic tape. However, each of these memory types has one or more of the following limitations: large physical size, low storage capacity, relatively high cost, poor robustness, slow access time and high power consumption.

Solid state diode-based OTP memory is disclosed in assignee's U.S. Ser. No. 09/875,356 filed Jun. 5, 2001. Compared to the conventional memory, the diode-based memory has a high shock tolerance, low power consumption, fast access time, moderate transfer rate and good storage capacity. The diode-based memory can fit into a standard portable interface (e.g., PCMCIA, CF) of a portable device.

In a diode-based memory device having multiple levels, each level has main memory and address logic (unlike conventional solid state memory such as DRAM). The address logic of the diode-based memory device is programmable. The address logic may be programmed after each level has been fabricated. Since no masking is required, physical processing is simplified.

Fault-tolerant address logic is desirable. If an address line is unusable, fault-tolerant address logic can still address the main memory.

SUMMARY

According to one aspect of the present invention, a set of address elements is configured by assigning a set of address configurations having a symmetric distance of at least t+1, where t is the maximum allowable number of defective address lines.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 5a–5b are illustrations of diode patterns for memory lines.

FIG. 7 is an illustration of a method of generating address configurations for the address logic.

DETAILED DESCRIPTION

Figure 1:
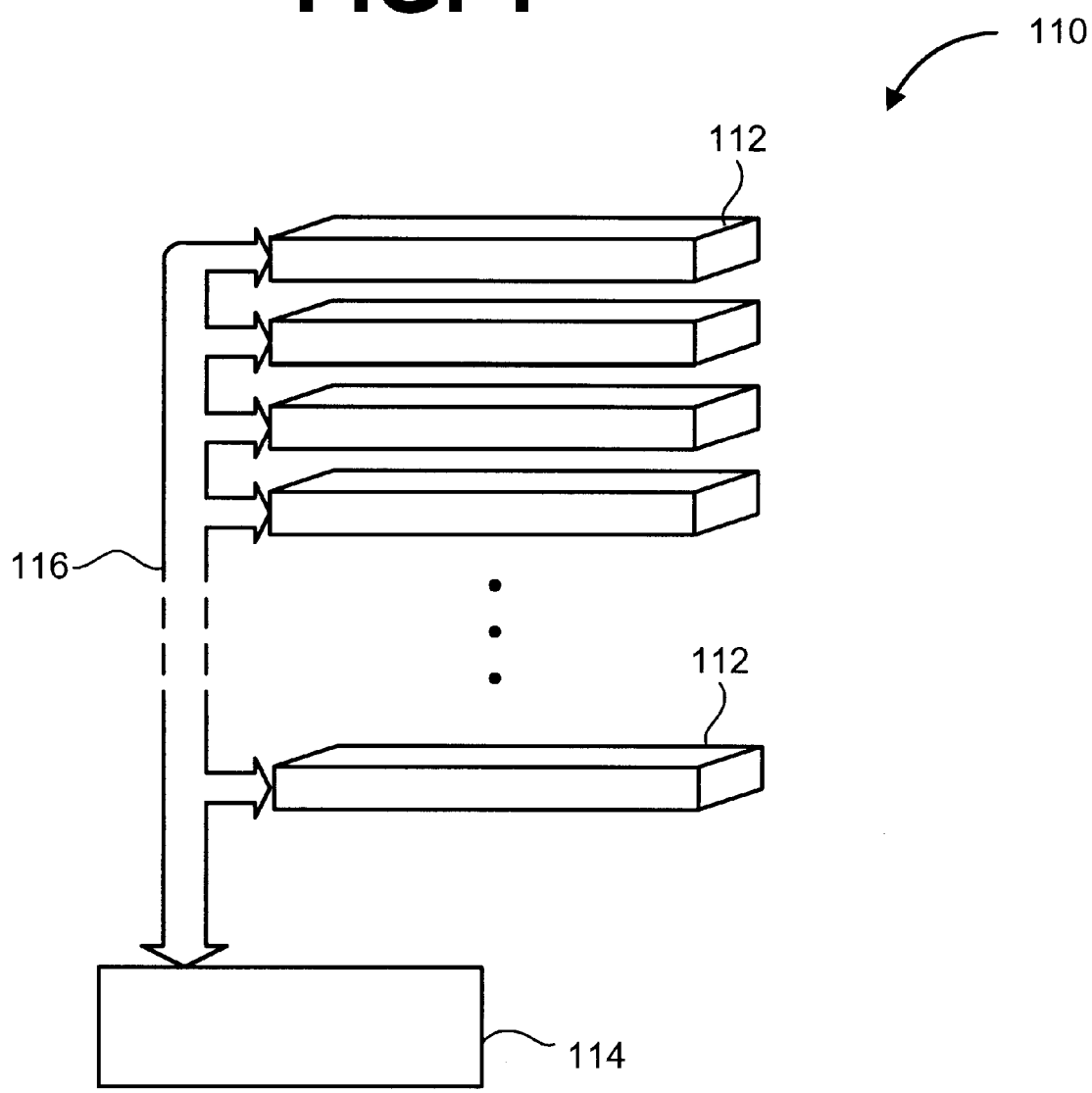
FIG. 1 is an illustration of a multi-level solid state memory device.

As shown in the drawings for the purpose of illustration, the present invention is embodied in a diode-based OTP memory device. In the paragraphs that follow, the structure of the OTP memory device will be described, followed by a description of an address protocol that can provide fault-tolerant address configurations. Fault-tolerant address logic can improve manufacturing yields of the OTP memory device.

FIG. 1 shows a multi-level solid state memory device 110. Multiple levels 112 are stacked on top of one another. Each level 112 includes main memory and address logic. The levels 112 are connected to control/interface circuitry 114 by a memory system interface 116. The control/interface circuitry 114 is formed in a substrate. The control/interface circuitry 114 performs error code correction (ECC) and defect management functions, as well as functions for operating the device 110. These functions include setting write voltages, setting write enable lines and controlling power sense striping, addressing the memory by converting logical addresses to address line patterns required to access physical memory locations, and data read processing of sense line outputs.

The system interface 116 includes address lines. Address logic on each level 112 shares the same address lines. When data is written to the device 110, the bits are not stored in contiguous memory elements. Instead, the bits of a word are stored on different levels 112.

Because the address logic is fault tolerant, one address line could be defective in one level, and another address line could be defective at another level, but each level would independently tolerate the defects.

Figure 2:
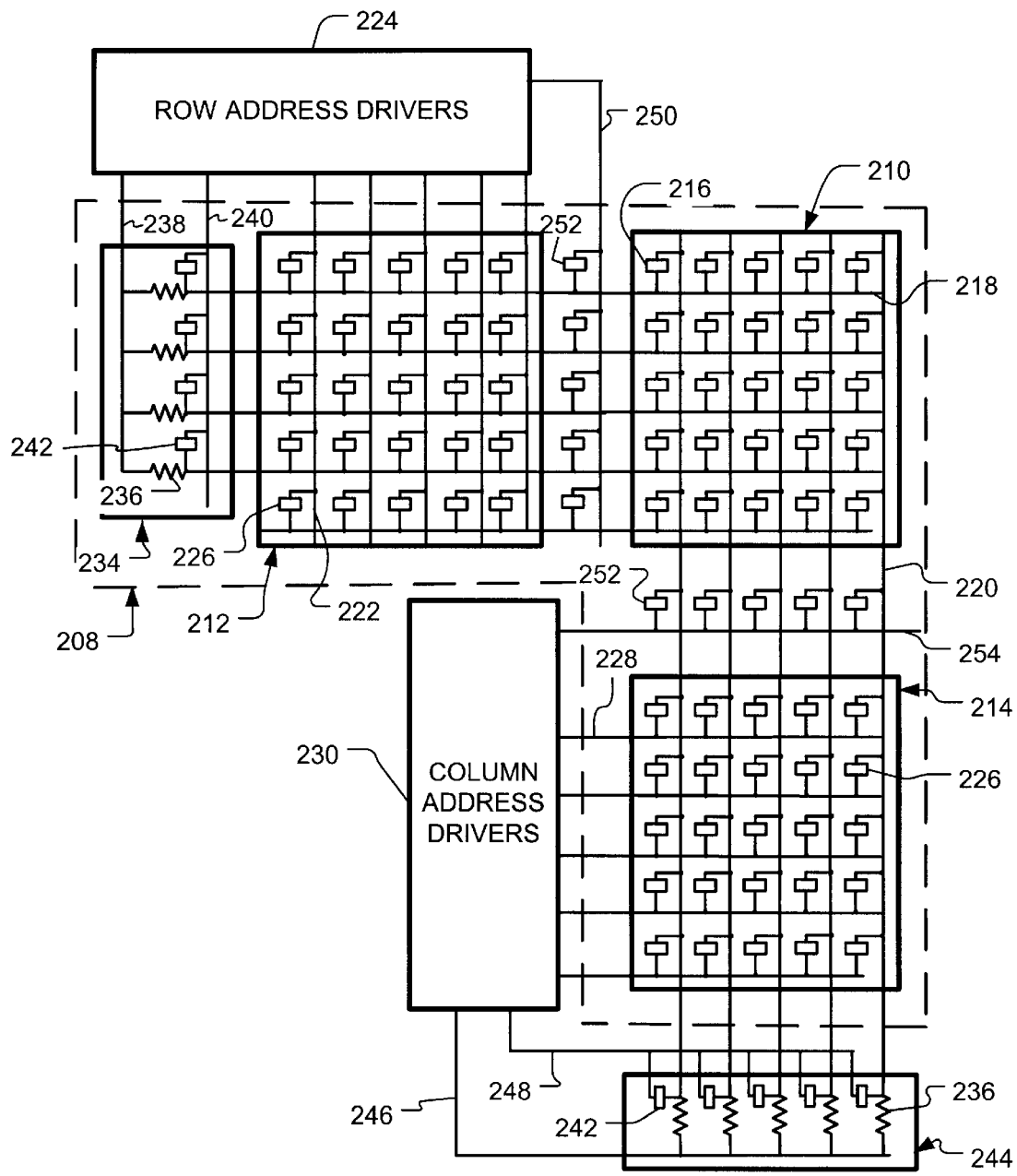
FIG. 2 is an illustration of a level of the solid state memory device, the level including address logic.

Reference is now made to FIG. 2, which shows a level 208 of a solid state memory device. The level 208 includes main memory 210 and programmable address logic 212, 214. The main memory 210 includes a cross point resistive array of OTP memory elements 216, word lines 218 extending along rows of the memory elements 216, and bit lines 220 extending along columns of the memory elements 216. There may be one word line 218 for each row of the memory elements 216 and one bit line 220 for each column of the memory elements 216. Each memory element 216 is located at a cross point of a word line 218 and a bit line 220. Only a relatively small number of memory elements 216 is shown to simplify the illustration of the level 208. In practice, arrays of any size may be used.

A memory line may refer to either a word line 218 or a bit line 220.

The address logic 212, 214 uses combinatorial diode logic to address the memory elements 216 during read and write operations. The address logic 212, 214 includes an OTP row decoder 212 for selecting the word lines 218. The row decoder 212 selects the word lines 218 by decoding addresses supplied on row address lines 222 (the addresses may be supplied by external row address drivers 224). The row decoder 212 includes a plurality of OTP address elements 226. Each address element 226 of the row decoder 212 is at a cross point of a word line 218 and a row address line 222.

The address logic 212, 214 also includes an OTP column decoder 214 for selecting the bit lines 220. The column decoder 214 selects the bit lines 220 by decoding addresses supplied on column address lines 228 (the addresses may be supplied by external column address drivers 230). The column decoder 214 also includes a plurality of OTP address elements 226. Each address element 226 of the column decoder 214 is at the cross point of a bit line 220 and a column address line 228.

One end of each word line 218 terminates at row sense logic 234. The row sense logic 234 includes multiple sense resistors 236, each sense resistor 236 connected between a row power line 238 and an end of a word line 218. A row sense line 240 crosses the word lines 218. The row sense logic 234 also includes multiple sense elements 242, each sense element 242 connected between the row sense line 240 and a word line 218.

One end of each bit line 220 terminates at column sense logic 244. The column sense logic 244 includes multiple sense resistors 236, each sense resistor 236 connected between a column power line 246 and an end of a bit line 220. A column sense line 248 crosses the bit lines 220. The column sense logic 244 also includes multiple sense elements 242, each sense element 242 connected between the column sense line 248 and a bit line 220.

A row programming line 250, between the main memory 210 and the row decoder 212, crosses the word lines 218. Programming elements 252 are connected between the row programming line 250 and the word lines 218.

A column programming line 254, between the main memory 210 and the column decoder 214, crosses the bit lines 220. Programming elements 252 are connected between the column programming line 254 and the bit lines 220.

The memory elements 216, the address elements 226, the sense elements 242 and the programming elements 252 may all be diode-based. This simplifies the fabrication of the level 208.

Figure 3A:
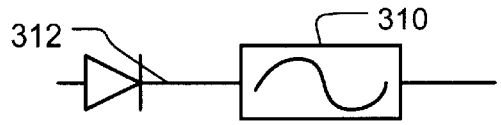
FIGS. 3a–3c are illustrations of different types of programmable elements in the level.
Figure 3B:
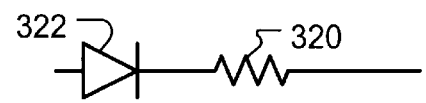
Figure 3C:
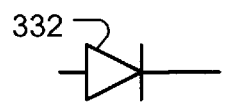

Different types of programmable elements 216/226/242/252 are shown in FIGS. 3a–3c. The programmable element of FIG. 3a includes a fuse 310 coupled in series with a diode 312. Prior to programming, the resistance state of such an element is low, with the fuse 310 intact. During programming, the resistance state of the element can be changed from low to high by "blowing" the fuse 310.

The programmable element of FIG. 3b includes a resistor 320 coupled in series with a diode 322. Prior to programming, the resistance state of such an element is low, with the resistor 320 intact. During programming, the resistance state of the element can be changed from low to high by "blowing" the resistor 320.

The programmable element of FIG. 3c includes only a diode 332. Prior to programming, the diode 332 is intact, whereby its resistance state is low. During programming, the diode 332 can be opened to change its resistance state from low to high. Such a diode 332 functions as a fuse. In the alternative, the diode 332 can function as an anti-fuse, going from a high resistance state to a low resistance state during programming.

The programmable elements 216/226/242/252 are not limited to the types shown in FIGS. 3a–3c. For example, the programmable elements 216/226/242/252 could include transistors instead of diodes.

Figure 4:
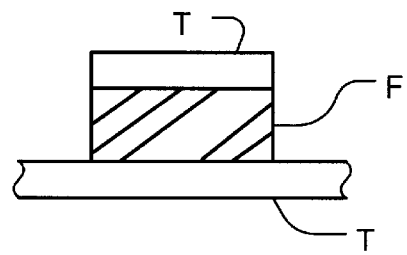
FIG. 4 is another illustration of a programmable element.

Returning to FIG. 2, the level 208 may be fabricated as follows. Column lines 220 are formed on a substrate, a multi-layer film of silicon is formed on the column lines 220, and word lines 218 are formed on the film. Each programmable element 216/226/242/252 may be formed as that portion of the film (F) between two crossing traces (T) (see FIG. 4). The size of the programmable element 216/226/242/252 is determined by the overlapping area between crossing lines and the thickness of the film. For example, a diode in main memory 210 is formed as that portion of the film between crossing word and bit lines 218 and 220.

The different layers of the film have appropriate dopings (and/or a combination of crystalline and amorphous silicon) to form the diodes 312, 322, 332. Additional layers with appropriate dopings can be added to form resistors 320, fuses 310, or anti-fuses. The sense resistors 236 may be formed by modifying the ends of the word and bit lines 218 and 220. The row and column address drivers 224 and 230 may be formed on the substrate, as part of the control/interface circuitry 114.

Data may be written to the main memory 210 by supplying row and column addresses to the row and column decoders 212 and 214. A write current flows through a selected word line 218 and a selected bit line 220 and, therefore, flows through the memory element 216 at the cross point of the selected word and bit lines 218 and 220. Magnitude of the write current is sufficient to change the resistance state of the selected element (e.g., by opening the fuse 310 of FIG. 3a, opening the resistor 320 of FIG. 3b, opening the diode 332 of FIG. 3c, shorting the anti-fuse).

The resistance state of a memory element 216 may be sensed by supplying row and column addresses to the row and column decoders 212 and 214. A voltage is applied to the row sense line 240 and a voltage of opposite polarity is applied to the column sense line 248. A sense current flows through a selected word line 218 and a selected bit line 220 and, therefore, flows through the memory element 216 at the cross point of the selected word and bit lines 218 and 220. Magnitude of the sense current indicates the resistance state of the selected memory element 216.

Figure 4A:
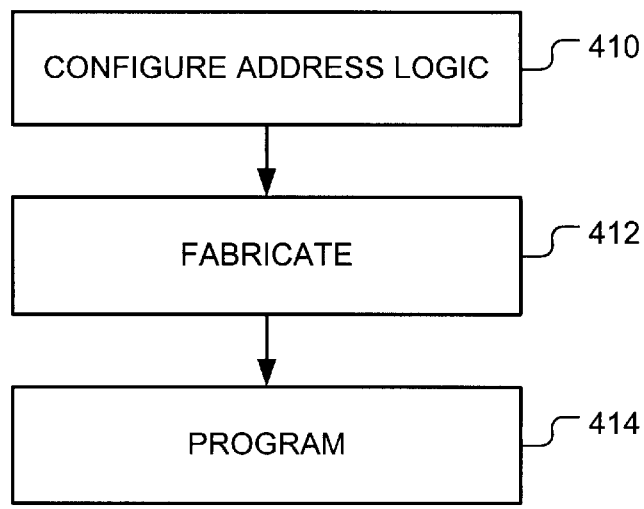
FIG. 4a is an illustration of a method of forming the address logic.

Reference is now made to FIG. 4a. The row and column decoders 212 and 214 may be configured (410) prior to device fabrication (412), and programmed (414) after the level 208 has been fabricated. The decoders 212 and 214 may be configured by assigning address configurations to memory lines. Each address configuration contains a bit pattern of logical 1's and logic 0's. Each bit in an address configuration corresponds to a programmable address element 226 connected to a memory line. The address elements 226 are fabricated according to the address configurations. For example, an address element 226 corresponding to an address configuration bit value of '0' has a different current-carrying capability than an address elements 226 corresponding to an address configuration bit value of '1'. Fabrication and programming of the address elements will now be described in greater detail. Address protocols for generating the address configurations will be discussed later.

Figure 5:
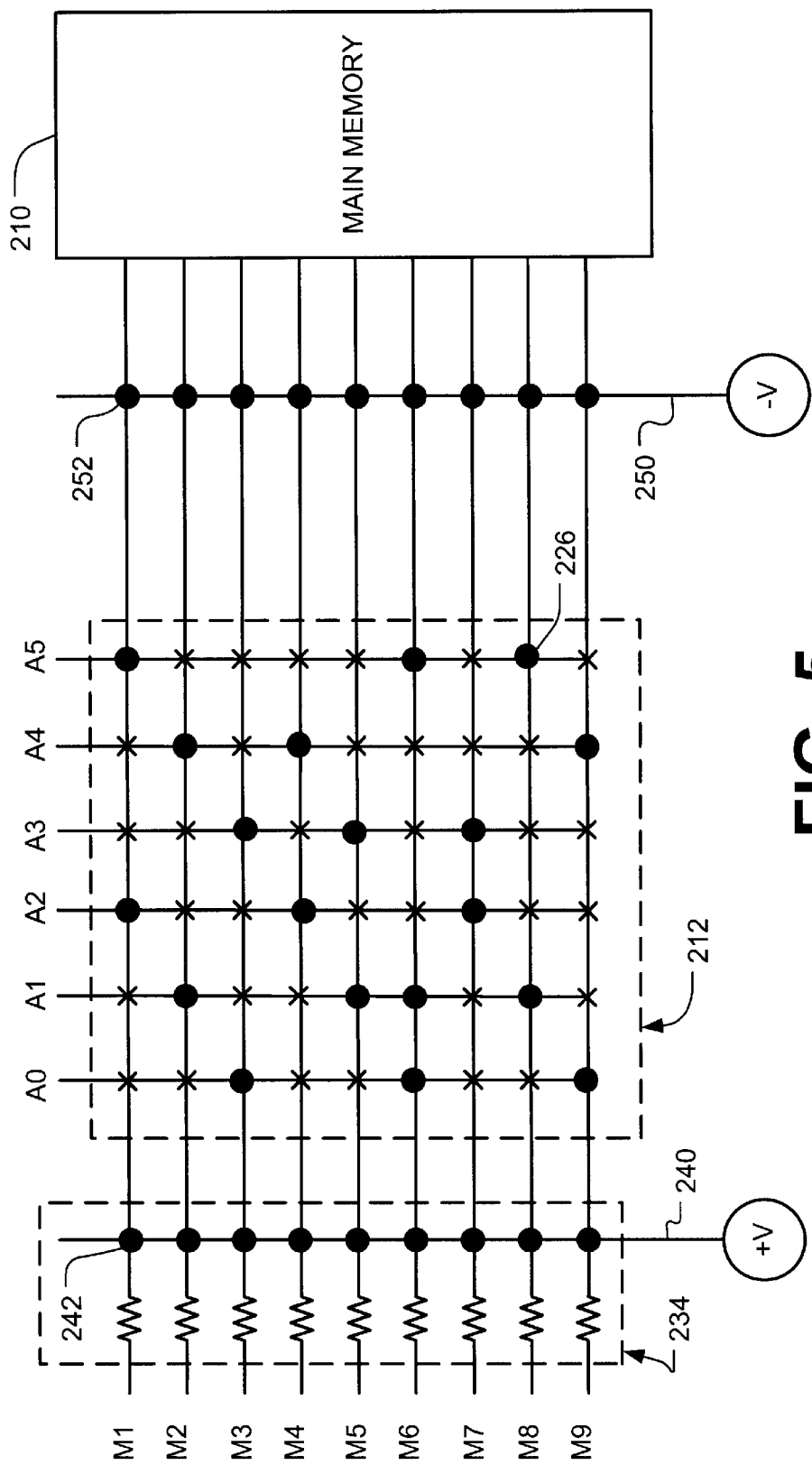
FIG. 5 is an illustration of address patterns for memory lines.

Reference is made to FIG. 5. The higher current-carrying capability elements, indicated by filled-in zeros (•), correspond to a first logic value of an address configuration bit. The lower current-carrying capability elements, indicated by crosses (X), correspond to a second logic value of an address configuration bit state. The address elements 226 indicated by filled-in zeros will not have their resistance states changed during programming. The address elements indicated by crosses will have their resistance states changed during programming. Merely for the purpose of illustration, the elements indicated by crosses correspond to logic '0' and the elements indicated by filled-in zeros correspond to a logic '1'. A logic '1' does not necessarily correspond to a high voltage.

During programming of the row decoder 212, a voltage (−V) is applied across the row programming line 250, and a voltage of opposite polarity (+V) is applied to the row sense line 240. (During programming of the column decoder 214, a voltage is applied across the column programming line 254, and a voltage of opposite polarity is applied to the column sense line 248.) This will effectively apply a voltage across two diodes connected back-to-back. The voltage is applied in such a manner that all address elements are reversed-biased and the sense elements are forward-biased. Consequently, a current flows through the address elements 226. This current causes the links of the address elements 226 denoted by crosses to break, but the current does not cause the links of the address elements 226 denoted by filled-in zeros to break. Thus, the address elements 226 denoted by filled-in zeros remain intact. The memory lines M1–M9 for the row decoder 212 are connected to different patterns of intact and changed address elements 226, such that a set of address lines that will de-select all but one of the memory lines.

Additional reference is made to FIG. 5a, which shows a diode pattern for a memory line (after programming). The diodes in the address elements 226 are active elements that form wired logic elements. If an address $a_0a_1a_2a_3a_4a_5$=110110 is applied to address lines A0–A5, the diodes connected to address lines A0, A1, A3 and A4 will be reverse-biased. As a result, current (indicated by the arrow) is allowed to flow through the memory line to the main memory 210.

The same address $a_0a_1a_2a_3a_4a_5$=110110 will de-select the memory line shown in FIG. 5b. For example, applying a logic '0' to address line A2 will cause the diode connected between address line A2 and memory line to become forward biased. As a result, current will be shunted through the forward-biased diode and will not flow to the main memory 210.

Figure 6A:
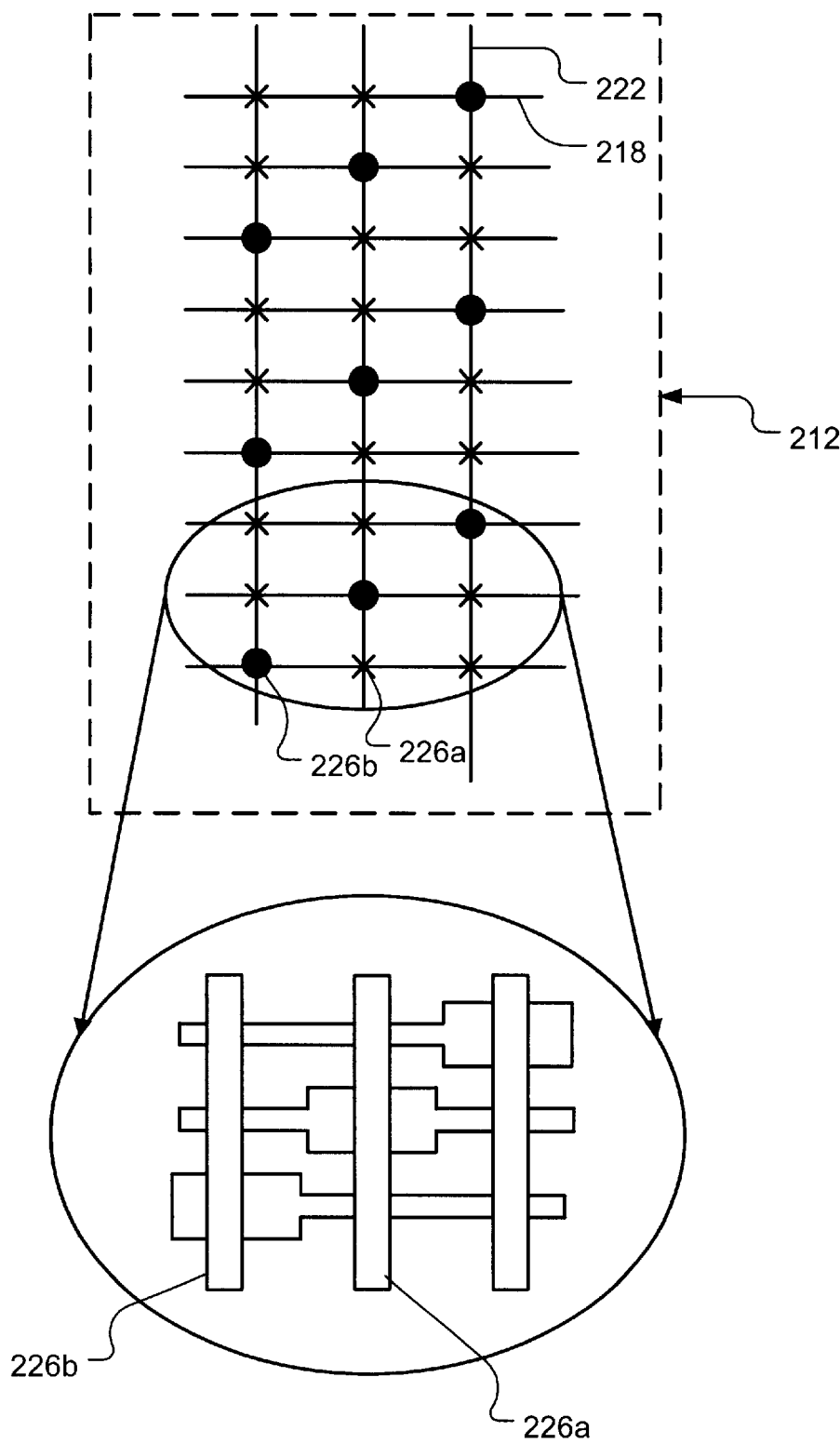
FIGS. 6a–6c are illustrations of different layouts for address elements of the address logic.
Figure 6B:
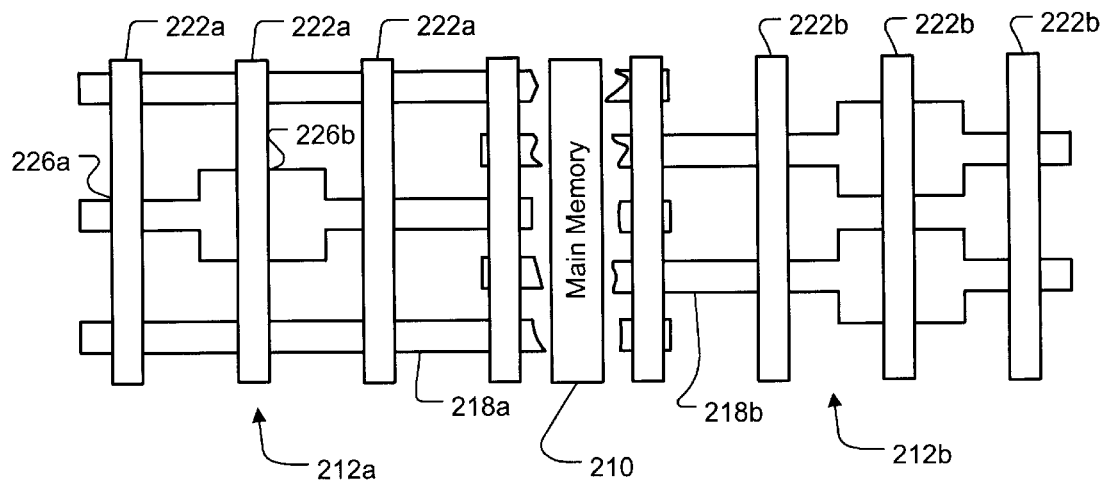
Figure 6C:
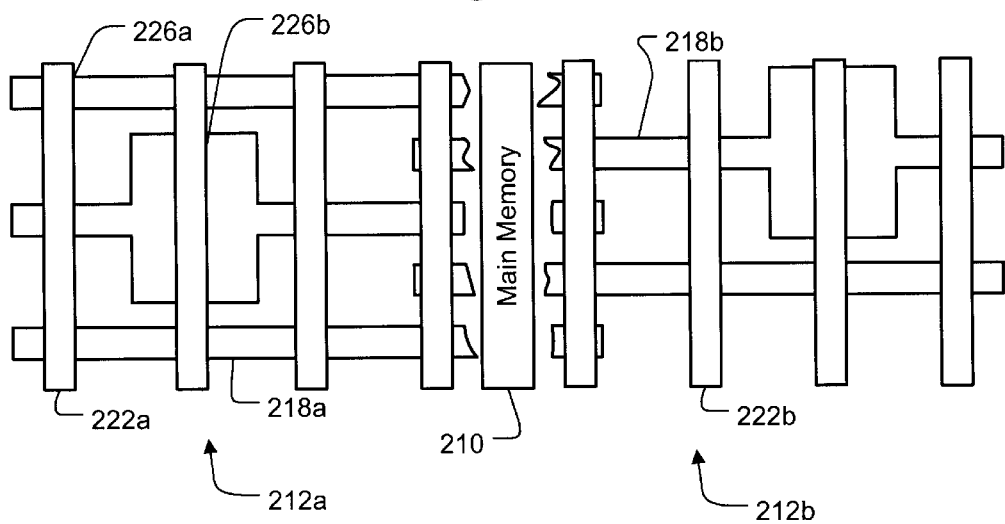

Reference is now made to FIGS. 6a–6c. The address elements 226b having the higher current-carrying capability may be made physically larger than the address elements 226a having the lower current-carrying capability. If an address protocol can guarantee that no column has adjacent enlarged address elements 226b, then the address logic may have the configuration shown in FIG. 6a. FIG. 6a shows a row decoder 212 in which columns do not contain any adjacent enlarged address elements 226b. Although not shown as such, the address elements 226a and 226b may be formed at full contact pitch.

If the address protocol cannot provide such a guarantee, whereby the address logic could include adjacent enlarged address elements in a column, the distance between word lines 18 may be increased. However, this would reduce the data storage density of the main memory.

Instead, the row decoder 212 may be divided into two spaced-apart sets 212a and 212b, as shown in FIG. 6b. Odd-numbered word lines 218a are interdigitated with even-numbered word lines 218b. A first set of address lines 222a crosses the odd-numbered word lines 218a, and a second set of address lines 222b crosses the even-numbered word lines 218b. The first and second sets of address lines 222a and 222b receive the same address signal.

This approach allows the size of adjacent address elements 226b to be enlarged threefold, yet it still allows the other address elements 226a to be fabricated at higher resolution. If the address protocol can guarantee that no column has adjacent enlarged address elements 226b, the size of the non-adjacent enlarged memory elements 226b can be increased fivefold (see FIG. 6c).

FIGS. 6a–6c were just described in connection with the row decoder 212. However, the same principles may be applied to the column decoder 214.

The address protocol involves a 1:1 mapping of n-bit address configurations to each one of L memory lines (e.g., L rows or L columns) so that no two rows are assigned the same address configuration and that no two columns are assigned the same address configuration.

Consider the address configurations shown in Table 1. There are six memory lines M1–M6 and four address lines A0–A3. A logic '0' applied to an address line will de-select all memory lines connected to that address line by intact elements. If an address $a_0a_1a_2a_3$=1100 is supplied to address lines A0, A1, A2 and A3, all memory lines M2–M6 except the first memory line M1 will be de-selected (the first and second address elements of the first line M1 are left intact, while the third and fourth address elements of the first memory line are not).

TABLE 1

|    | A0 | A1 | A2 | A3 |
|----|----|----|----|----|
| M1 | •  | •  | X  | X  |
| M2 | •  | X  | •  | X  |
| M3 | •  | X  | X  | •  |
| M4 | X  | •  | •  | X  |
| M5 | X  | •  | X  | •  |
| M6 | X  | X  | •  | •  |

Because the address lines are physically and electrically connected to corresponding address elements on all of the layers, an address line can be rendered unusable by a single defective connection on any of the layers. An address line might be rendered unusable by defects occurring over time due to aging or environmental processes. If one of the address lines A0, A1, A2 or A3 becomes unusable, that address line will be unable to de-select certain memory lines. If address line A3 becomes defective, it will not be able to de-select memory lines M2, M4 and M6.

This problem may be avoided by the use of an address protocol that provides fault-tolerant address configurations. The fault-tolerance has a built-in redundancy that allows the memory device to function correctly even if defects arise. Thus the fault tolerance can improve manufacturing yields. The cost is an increase in address lines.

Reference is made to FIG. 7. Fault-tolerance may be achieved by assigning a set of non-covering address configurations having a symmetric distance of at least t+1, where t is the maximum allowable number of defective address lines (710).

Certain terms will now be explained. Let $u_1, u_2 \in \{0,1\}^n$. The unidirectional distance $d_U(u_1, u_2)$ is the number of positions where $u_1$ has 1's and $u_2$ has 0's. The symmetric distance is $d_S(u_1, u_2)$=min$\{d_U(u_1, u_2), d_U(u_2, u_1)\}$. The Hamming distance is $d_H(u_1, u_2)$=$d_U(u_1, u_2)$+$d_U(u_2, u_1)$. The Hamming distance is at least twice the symmetric distance; that is, $d_H(u_1, u_2) \geq 2 d_S(u_1, u_2)$. For example, if $u_1$=1110 and $u_2$=1001, then $d_U(u_1, u_2)$=2 and $d_U(u_2, u_1)$=1; $d_H(u_1, u_2)$=3; and $d_S(u_1, u_2)$=1. For a set U of at least two n-bit words, the symmetric distance $d_S(U)$ is the minimum symmetric between any two distinct words in the set U, and the Hamming distance is $d_H(U)$ is the minimum Hamming distance between any two distinct words in the set U.

If $d_U(u_1, u_2)$=0, then $u_2$ covers $u_1$. Therefore, $d_S(u_1, u_2)$=0 if and only if either $u_2$ covers $u_1$ or $u_1$ covers $u_2$. Memory lines are assigned address configurations such that no address configuration covers the other. This constraint prevents a single address from selecting more than one memory line.

Thus, if the n-bit words in a set are non-covering, then the set of words may be assigned as address configurations for n address lines.

One set of words satisfying these constraints are t-Sperner (n,L) code words. A t-Sperner(n,L) code is a set U that consists of L n-bit words, such that $d_S(U) \geq t+1$. An example of a 1-Sperner(7,6) code is U={1100100, 1010010, 1001101, 0110001, 0101010, 0011100}. The Hamming distance is $d_H(U)=4$. Even if t=1 of the address lines becomes defective, no word will cover the other.

The address words may be constant weight code (CWC) words, which are a type of t-Sperner words. A set C of n-bit words is a CWC (n,2t+2,w) if each word in the set C has a Hamming weight (w) and $d_H(C) \geq 2t+2$. These conditions imply that C is a t-Sperner(n,L) code.

Consider the address configurations in Table 2. An additional three address lines (A4, A5 and A6) are added. No address configuration covers the other even when any t=1 address lines are unusable. Thus the maximum allowable number of defective address lines is t=1.

TABLE 2

|    | A0 | A1 | A2 | A3 | A4 | A5 | A6 |
|----|----|----|----|----|----|----|----|
| M1 | ● | ● | X | X | ● | X | X |
| M2 | ● | X | ● | X | X | ● | X |
| M3 | ● | X | X | ● | X | X | ● |
| M4 | X | ● | ● | X | X | X | ● |
| M5 | X | ● | X | ● | X | ● | X |
| M6 | X | X | ● | ● | ● | X | X |

If address line Al becomes unusable, the remaining six address lines A0 and A2–A6 will be able to unambiguously select each of the six memory lines M1–M6. An address $a_0 a_2 a_3 a_4 a_5 a_6 = 100100$ will still de-select all memory lines M2–M6 except the first memory line M1.

The address protocols are not limited to the memory device described above. They may be applied to any device using combinatorial address logic.

The present invention is not limited to the specific embodiments described and illustrated above. Instead, the present invention is construed according to the claims that follow.

What is claimed is:

1. A method of forming a set of address elements, the method comprising assigning a set of address configurations having a symmetric distance of at least t+1, where t is the maximum allowable number of defective address lines.

2. The method of claim 1, wherein the address configurations are t-Sperner(n,L) code words.

3. The method of claim 1, wherein the address configurations are constant weight code (CWC) words.

4. The method of claim 1, wherein the address configurations have the same weight and wherein a Hamming distance between any two address configurations is at least 2t+2.

5. The method of claim 1, further comprising fabricating the address elements according to bit values of the address configurations.

6. The method of claim 5, wherein current carrying capability of the elements is determined by the bit values of the address configurations.

7. The method of claim 6, further comprising programming the address elements by supplying current to the address elements, the current causing lower current-carrying capability elements to change resistance states and higher current-carrying capability elements to remain intact.

8. The method of claim 1, wherein the address elements include diodes; and wherein the diodes are programmed to form wired gates.

9. A method comprising:
generating address configurations for memory lines of a solid state memory device, the address configurations having a symmetric distance of at least t+1, where t is the maximum allowable number of defective address lines; and
fabricating a level of the memory device, the level including address elements connected to the memory lines, each address configuration corresponding to a memory line, address elements of a memory line fabricated according to the corresponding address configuration.

10. The method of claim 9, wherein the address configurations are t-Sperner(n,L) code words.

11. The method of claim 9, wherein current carrying capability of the elements is determined by bit values of the address configurations.

12. The method of claim 11, further comprising programming the address elements by supplying current to the address elements, the current causing lower current-carrying capability elements to change resistance states and higher current-carrying capability elements to remain intact.

13. Address logic for a solid state memory device, the address logic comprising groups of address elements, the address elements configured according to a set of address configurations having a symmetric distance of at least t+1, where t is the maximum allowable number of defective address lines.

14. The address logic of claim 13, wherein the address configurations are non-covering.

15. The address logic of claim 13, wherein prior to programming, an address element corresponding to an address configuration bit having a first value has a different current-carrying capability than an address element corresponding to an address configuration bit having a second value.

16. The address logic of claim 15, wherein after programming, address elements having a higher current-carrying capability are intact, and address elements having a lower current-carrying capability are not intact.

17. The address logic of claim 13, wherein programmed address elements provide wired combinatorial logic.

18. The address logic of claim 13, wherein the address elements include diodes.

19. The address logic of claim 13, wherein the address configurations are t-Sperner(n,L) code words.

20. The address logic of claim 13, wherein the address configurations are constant weight code (CWC) words.

21. The address logic of claim 13, wherein the address configurations have the same weight and wherein a Hamming distance between any two address configurations is at least 2t+2.

22. A solid state memory device comprising a plurality of levels, each level including:
main memory; and
address logic for the main memory, the address logic including address lines and groups of address elements configured according to a set of address configurations having a symmetric distance of at least t+1, where t is the maximum allowable number of defective address lines.

23. The device of claim 22, wherein prior to programming, an address element corresponding to an address configuration bit having a first value has a different current-carrying capability than an address element corresponding to an address configuration bit having a second value.

24. The device of claim 22, wherein after programming, address elements having a higher current-carrying capability are intact, and address elements having a lower current-carrying capability are not intact.

25. The device of claim 24, wherein programmed address elements provide wired combinatorial logic.

26. The device of claim 22, wherein the address elements include diodes.

27. The device of claim 22, wherein the address configurations are t-Sperner(n,L) code words.

28. The device of claim 22, wherein the address configurations are constant weight code (CWC) words.

29. The device of claim 22, wherein the address configurations have the same weight and wherein a Hamming distance between any two address configurations is at least $2t+2$.

* * * * *